(12) United States Patent
Kaneko et al.

(10) Patent No.: US 10,829,064 B2
(45) Date of Patent: *Nov. 10, 2020

(54) ELECTRONIC CONTROL DEVICE

(71) Applicant: HITACHI AUTOMOTIVE SYSTEMS, LTD., Ibaraki (JP)

(72) Inventors: Yujiro Kaneko, Hitachinaka (JP); Yoshio Kawai, Hitachinaka (JP)

(73) Assignee: HITACHI AUTOMOTIVE SYSTEMS, LTD., Ibaraki (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/689,881

(22) Filed: Nov. 20, 2019

(65) Prior Publication Data

US 2020/0086812 A1 Mar. 19, 2020

Related U.S. Application Data

(63) Continuation of application No. 16/060,716, filed as application No. PCT/JP2016/081654 on Oct. 26, 2016, now Pat. No. 10,501,031.

(30) Foreign Application Priority Data

Dec. 10, 2015 (JP) .................................. 2015-240709

(51) Int. Cl.
*H05K 5/00* (2006.01)
*B60R 16/023* (2006.01)
(Continued)

(52) U.S. Cl.
CPC ........ *B60R 16/0239* (2013.01); *B60R 16/005* (2013.01); *B60R 16/0238* (2013.01);
(Continued)

(58) Field of Classification Search
USPC .............................. 361/728, 752, 796, 800
See application file for complete search history.

(56) References Cited

U.S. PATENT DOCUMENTS 5,923,084 A 7/1999 Inoue et al.
8,305,763 B2 11/2012 Kato
(Continued)

FOREIGN PATENT DOCUMENTS

CN 202262171 U 5/2012
JP 2000-228243 A 8/2000
(Continued)

OTHER PUBLICATIONS

International Search Report for WO 2017/098826 A1, dated Feb. 7, 2017.

(Continued)

*Primary Examiner* — Hung S. Bui
(74) *Attorney, Agent, or Firm* — Volpe Koenig

(57) ABSTRACT

Provided is a highly reliable electronic control device which has not only an effect of reducing costs but also an effect of facilitating a manufacturing process. To include a control board; a connector including a terminal connected to the control board; and a housing case to which the control board and the connector are fixed. The control board has a part sealed with a sealing resin. The connector is disposed at a position facing another part of the control board, being isolated from the sealing resin by the control board and the housing case.

15 Claims, 5 Drawing Sheets

(51) Int. Cl.
    *B60R 16/00*     (2006.01)
    *B60R 21/01*     (2006.01)

(52) U.S. Cl.
    CPC ......... *H05K 5/0056* (2013.01); *H05K 5/0069* (2013.01); *B60R 2021/01006* (2013.01); *H05K 5/0052* (2013.01)

(56) References Cited

U.S. PATENT DOCUMENTS

| | | | |
|---|---|---|---|
| 8,727,794 | B2 | 5/2014 | Tanaka et al. |
| 8,737,075 | B2 | 5/2014 | Yamashita et al. |
| 10,501,031 | B2 * | 12/2019 | Kaneko ................ H05K 5/0056 |
| 2008/0144290 | A1 | 6/2008 | Brandt et al. |
| 2014/0065877 | A1 | 3/2014 | Ohhashi |

FOREIGN PATENT DOCUMENTS

| | | |
|---|---|---|
| JP | 2005-142213 A | 6/2005 |
| JP | 2007-273796 A | 10/2007 |
| JP | 2014-049702 A | 3/2014 |

OTHER PUBLICATIONS

Chinese Office Action dated Sep. 2, 2019 for the Chinese Patent Application No. 201680061971.4.

\* cited by examiner (a)

(b)

(c)

(a)

(b)

(c)

(a)

(b)

(c)

(a)

(b)

(c)

ELECTRONIC CONTROL DEVICE

CROSS-REFERENCE TO RELATED PATENT APPLICATION

This U.S. non-provisional patent application is a continuation of U.S. patent application Ser. No. 16/060,716 filed on Jun. 8, 2018, which claims priority under 35 U.S.C. § 119 of Japanese Patent Application No. 2015-240709, filed on Dec. 10, 2015, and International Application No. PCT/JP2016/081654, filed on Oct. 26, 2016, the whole contents of which are hereby incorporated by reference.

TECHNICAL FIELD

The present invention relates to an electronic control device such as an engine control unit and an automatic transmission control unit which are mounted on automobiles, and particularly relates to a structure of an electronic control device.

BACKGROUND ART

With a background of environmental issues and energy issues, more and more automobiles are mounted with electrical components at an accelerating rate, leading to a great increase in the number of electronic control devices mounted on an automobile. Such an increase in the number limits places to mount electronic control devices, and it is inevitable to mount the electronic control devices in an engine room which is under severe environment in an automobile. On the other hand, expansion of a cabin space for the purpose of improving amenity of an automobile leads to downsizing of an engine room. In such manners, a large number of electronic control devices and wire harnesses thereof are arranged in a downsized engine room, so that problems such as difficult layout, weight increase, and cost increase are to be solved. Therefore, there is a demand for downsizing, weight reduction, and cost reduction of electronic control devices. In addition to those requirements, there is a tendency of shortening wire harnesses. Along with this tendency, an engine control device, for example, is mounted much closer to an engine than ever before, and there is concern that high heat and high vibration of the engine may affect the engine control device.

Therefore, improvements in resistance to high temperatures and resistance to vibrations are required in electronic control devices. As a countermeasure for the requirement, there is known a structure in which a control board mounted with electronic components is sealed with resin. Sealing the control board with resin enables reduction in thermal influences on the electronic components and enables suppression of vibrations of the board under vibrational environment. However, the structure of resin seal has harmful effects due to resin molding, so that countermeasures for the effects are required (PTL 1).

The electric electronic module described in PTL 1 includes an electronic circuit board on which an electronic circuit is mounted; a metal base on which the electronic circuit board is mounted; and a connector, in which the electronic circuit board is sealed with resin. In such a configuration, a potting resin or a premold resin is filled inside the connector. Such a sealing resin prevents deformation of a connector housing caused by resin molding pressure. In addition, as an exemplary method not using a potting resin, an alignment plate is fixed to the metal base so as to prevent the sealing resin from flowing into the connector.

CITATION LIST

Patent Literature

PTL 1: JP 2007-273796 A

SUMMARY OF INVENTION

Technical Problem

However, the technique disclosed in PTL 1 requires the use of a potting resin to fill inside the connector, which increases costs and the number of steps in a production process. Furthermore, in a case where an alignment plate is used, the alignment plate is deformed by resin molding pressure so that a connector terminal may be deformed, which may affect the reliability.

An object of the present invention is to provide a highly reliable electronic control device which has not only an effect of reducing costs but also an effect of facilitating a manufacturing process.

Solution to Problem

The present invention includes: a control board; a connector including a terminal connected to the control board; and a housing case to which the control board and the connector are fixed, wherein the control board has apart sealed with a sealing resin, the connector is disposed at a position facing another part of the control board, and the connector is isolated from the sealing resin by the control board and the housing case.

Advantageous Effects of Invention

According to the present invention, it is possible to manufacture a highly reliable electronic control device at a low cost and with a simple manufacturing process.

DESCRIPTION OF EMBODIMENT

Figure 1:
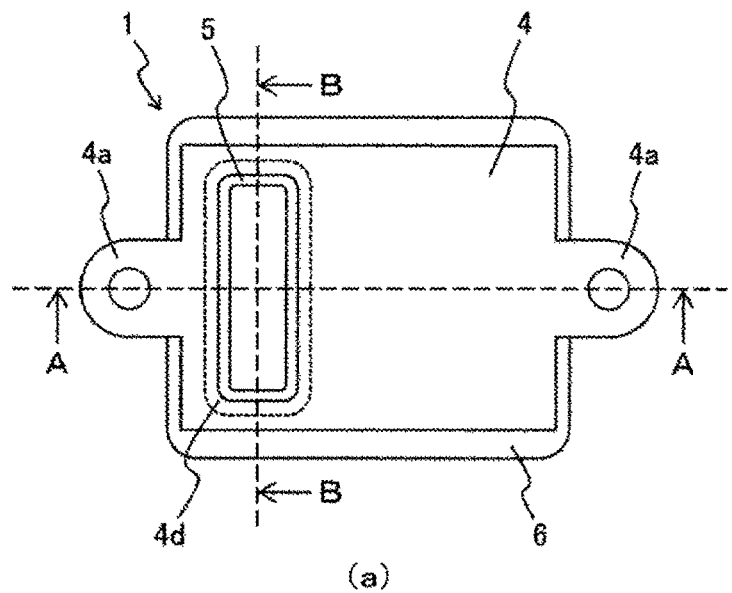
FIG. 1 is a plan view and a cross-sectional view of an electronic control device according to a first embodiment of the present invention.
Figure 1:
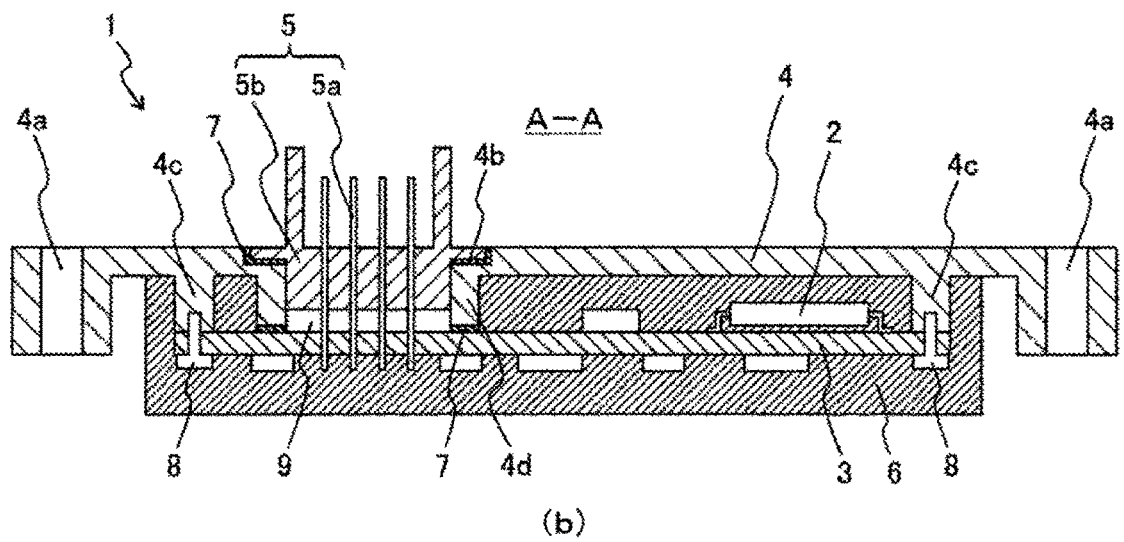
Figure 1:
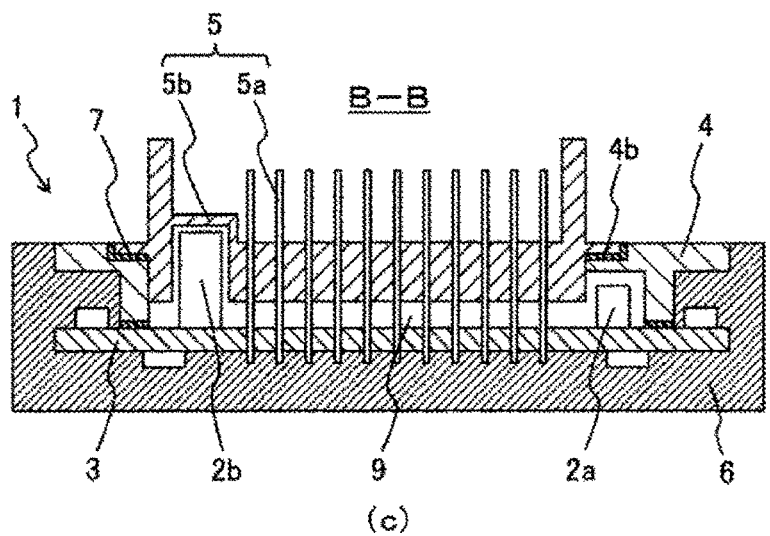

An embodiment of the present invention will now be described with reference to the accompanying drawings. In the drawings, the same members are denoted by the same reference numerals, and duplicate explanation will be omitted as appropriate.

First Embodiment

FIG. 1(a) is a plan view of an electronic control device according to a first embodiment of the present invention, FIG. 1(b) is a cross-sectional view in the direction of the arrow A-A of FIG. 1(a), and FIG. 1(c) is a cross-sectional view in the direction of the arrow B-B of FIG. 1(a). FIG. 2 is a view showing an assembly procedure of the electronic control device according to the first embodiment of the present invention.

Figure 2:
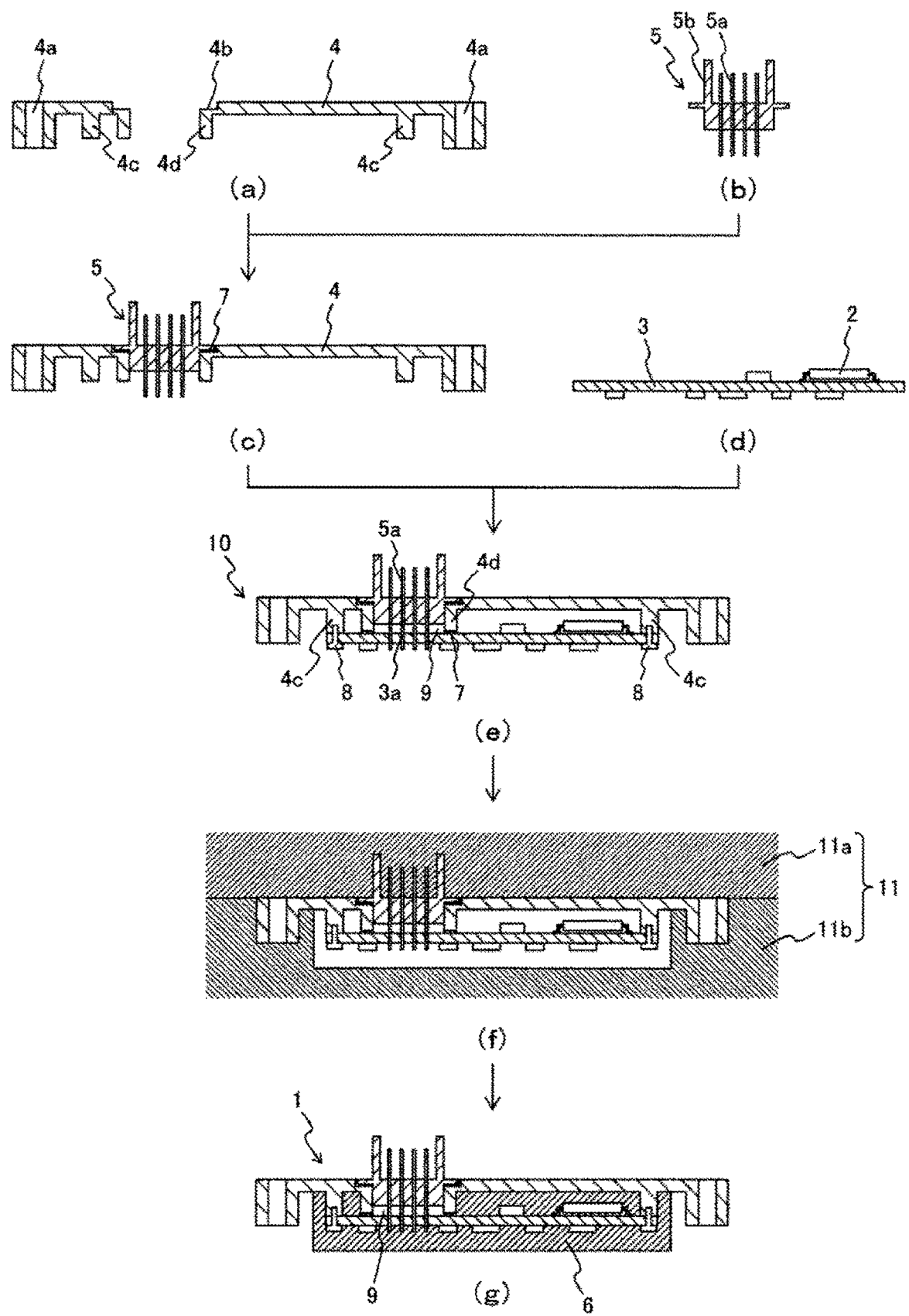
FIG. 2 is a view showing an assembly procedure of the electronic control device according to the first embodiment of the present invention.

As shown in FIG. 1, an electronic control device 1 includes a control board 3 on which an electronic component 2 such as a microcomputer is mounted; a housing case 4; and a connector 5. The control board 3 is molded with a sealing resin 6.

As shown in FIG. 1(b), the housing case 4 includes a vehicle fixing unit 4a configured to fix the electronic control device 1 to a vehicle; a connector-mounting unit 4b; a control board-mounting unit 4c; and a frame 4d that surrounds the connector 5. These members are molded with the housing case 4 in an integrated manner. A preferable example of a material of the housing case 4 includes a metallic material having high thermal conductivity, shielding property, and rigidity. From viewpoints of mass productivity, weight reduction, radiation performance, and costs, the housing case 4 preferably includes aluminum or an aluminum alloy. The housing case 4 may be subjected to surface treatment such as surface roughening, and alumite treatment. Accordingly, an adhesion force between the housing case 4 and the sealing resin 6 is enhanced, and the sealing resin 6 is hardly peeled off with respect to stress caused by changes in ambient temperature or by vibrations, which improves the reliability of the electronic control device 1.

As shown in FIG. 1(b), the connector 5 includes a connector terminal 5a configured to connect a vehicle harness with the control board 3; and a connector housing 5b configured to align and hold the connector terminal 5a at a specified pitch. From viewpoints of conductivity, downsizing, and costs, a material of the connector terminal 5a may be copper, or a copper alloy. From viewpoints of lightweight and excellency in heat resistance, preferable materials of the connector housing 5b are polybutylene terephthalate (PBT) resin, polyamide (PA) 66 resin, and polyphenylene sulfide (PPS) resin.

Hereinafter, the assembly procedure of the electronic control device 1 will be described with reference to FIG. 2.

First, as shown in FIG. 2(c), the connector 5 is inserted into the housing case 4 and attached to the same. At that time, an adhesive seal material 7 is applied in advance to the connector-mounting unit 4b of the housing case, the connector 5 is then placed on the connector-mounting unit 4b, and the seal material 7 is cured. Accordingly, it is possible to prevent foreign matters, water, and the like from entering into the electronic control device 1 from a gap between the housing case 4 and the connector 5. Furthermore, using the adhesive seal material 7 makes it possible to fix the connector 5 to the housing case 4. If required, a screw may be used for fixing.

Next, as shown in FIG. 2(d), the electronic component 2 such as a microcomputer is mounted on the control board 3. As for the control board 3, a resin wiring board based on glass epoxy resin or the like is used. When mounting the electronic component 2 on the control board 3, lead-free solder is used such as Sn—Cu solder, Sn—Ag—Cu solder, and Sn—Ag—Cu—Bi solder.

Next, as shown in FIG. 2(e), the control board 3 is attached to the housing case 4, and a sub-assembly 10 is assembled. At that time, the control board 3 is placed on the control board-mounting unit 4c of the housing case 4, and the control board 3 is fixed to the housing case 4 with a screw 8. The number of points fixed by the screw 8 is preferably 3 or more. At that time, the adhesive seal material 7 is applied to a lower end face (contact portion) of the frame 4d that comes into contact with the control board 3, the control board 3 is then placed on the frame 4d, and the seal material 7 is cured. Accordingly, it is possible to reliably prevent the sealing resin 6 from entering a resin-unsealed space 9 defined by the control board 3, the housing case 4, and the connector 5. Isolation of the connector 5 from the sealing resin 6 prevents deformation of the connector 5 due to resin molding pressure. Furthermore, adhesively fixing the control board 3 to the housing case 4 makes it possible to prevent deformation of the control board 3 due to resin molding pressure. Still further, providing the frame 4d in the existing housing case 4 makes it possible to form the resin-unsealed space 9 without any additional components such as a cover.

With regard to connection between the connector 5 and the control board 3, the connector terminal 5a is inserted into a through hole 3a of the control board 3, and those members are joint by lead-free solder such as Sn—Cu solder, Sn—Ag—Cu solder, and Sn—Ag—Cu—Bi solder. It should be noted that the connector 5 may be of a surface-mount type or a press-fit type.

Next, as shown in FIG. 2(f), the sub-assembly 10 is set in a die 11 for resin seal. In this embodiment, the sub-assembly 10 is set in a movable upper die 11a, and as the upper die 11a moves, the sub-assembly 10 is set in a fixed lower die 11b. An upper surface of the housing case 4 and a surface of the vehicle fixing unit 4a which are not to be molded with the sealing resin 6 are directly pressed by the die 11 so as not to come into contact with the resin at the time of resin molding.

In order to secure fluidity of the sealing resin 6 and to meticulously fill the sealing resin 6 into the metal die 11, the metal die 11, the sub-assembly 10, and the sealing resin 6 may be preheated. The sealing resin 6 may be a thermosetting epoxy resin, an unsaturated polyester resin, or a thermoplastic resin. Examples of a sealing method include transfer molding, compression molding, injection molding, and hot melt molding. With regard to physical properties of the sealing resin 6, it is preferable that linear expansion coefficient is in a range of 10 to 30×10-6/° C., and thermal conductivity is in a range of 0.5 to 3 W/mK.

After filling the sealing resin 6 into the die 11 and curing the resin, the resin molded article is taken out of the die 11, and the electronic control device 1 with the resin-unsealed space 9 as shown in FIG. 2(g) is completely manufactured.

If there are electronic components 2a and 2b which are not sealed with resin, the electronic components 2a and 2b may be mounted in advance on a part of the control board 3 which is exposed to the resin-unsealed space 9 as shown in FIG. 1(c). With regard to the electronic component 2b which is taller than the housing case 4, it is disposed directly under the connector 5, and the connector housing 5b is shaped to correspond to the electronic component 2b. Accordingly, while the height of the electronic control device 1 is controlled, the control board 3 can be mounted with the electronic component 2b that has a larger height than that of the electronic components 2 and 2a mounted on other parts. An example of the electronic components 2a and 2b disposed in the resin-unsealed space 9 includes an electrolytic capacitor. In an electrolytic capacitor, a small amount of an electrolytic solution inside the capacitor is usually vaporized and leaked to the outside. Therefore, sealing the electrolytic capacitor with resin causes accumulation of vaporized gas around an electrode of the electrolytic capacitor, which may lead to short-circuiting. Furthermore, an electrolytic capacitor is generally provided with an explosion-proof valve that releases gas in a case where internal gas pressure becomes high. However, sealing the electrolytic capacitor with resin disables the function of an explosion-proof valve so that gas cannot be released. As alternative components of the electrolytic capacitor, a resin-sealable tantalum capacitor, a ceramic capacitor, and the like may be used, but these capacitors are expensive than the electrolytic capacitor and leads to cost increase of the electronic control device 1.

According to the electronic control device 1 of this embodiment, as the connector 5 is isolated from the sealing resin 6 by the frame 4d molded with the housing case 4 in an integrated manner, it is possible to prevent the deformation of the connector 5 caused by the resin molding pressure and to prevent the deformation of the terminal, which ensures the reliability of the electronic control device 1.

In addition, only providing the frame 4d in the existing housing case 4 makes it possible to form the resin-unsealed space 9 and to dispose a relatively inexpensive electrolytic capacitor in the resin-unsealed space 9, which allows cost reduction of the electronic control device 1.

Second Embodiment

An electronic control device according to a second embodiment of the present invention will now be described, focusing on differences from the first embodiment. FIG. 3(a) is a plan view of the electronic control device according to this embodiment, FIG. 3(b) is a cross-sectional view in the direction of the arrow A-A of FIG. 3(a), and FIG. 3(c) is a cross-sectional view in the direction of the arrow B-B of FIG. 3(a).

Figure 3:
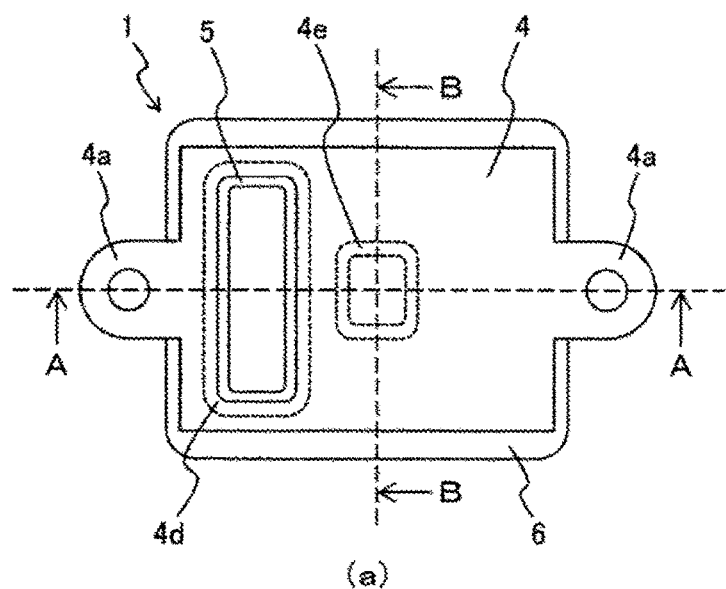
FIG. 3 is a plan view and a cross-sectional view of an electronic control device according to a second embodiment of the present invention.
Figure 3:
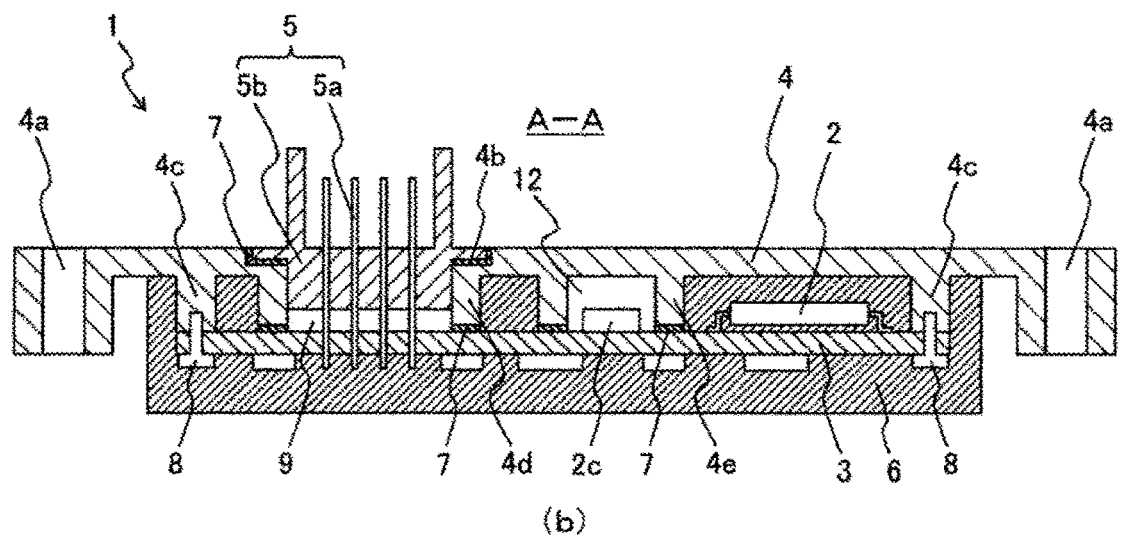
Figure 3:
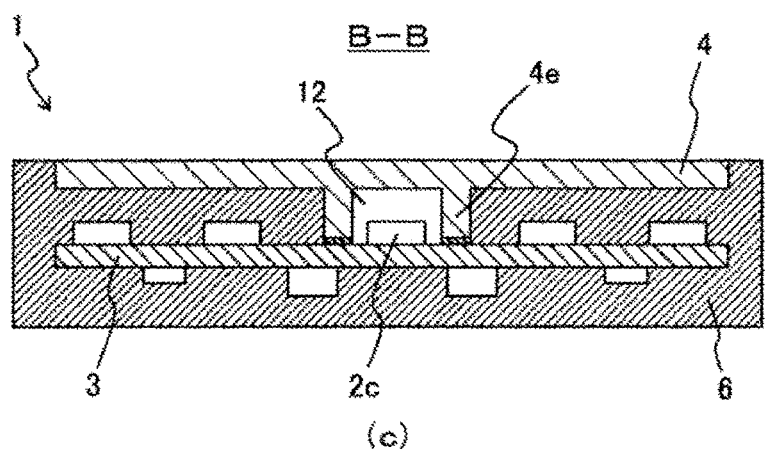

In FIG. 3, a housing case 4 of an electronic control device 1 includes a frame 4e molded in an integrated manner. The frame 4e is disposed outside a frame 4d that surrounds a connector 5, protruding from a surface opposing a control board 3 of the housing case 4, and surrounding an electronic component 2c which is disposed on the control board 3 and is not sealed with resin. When the control board 3 is attached to the housing case 4, a seal material 7 is applied to a lower end face (contact portion) of the frame 4e that comes into contact with the control board 3, the control board 3 is then placed on the frame 4e, and the seal material 7 is cured. Accordingly, a resin-unsealed space 12 is formed around the resin-unsealed electronic component 2c, and when the entire control board 3 is molded with the sealing resin 6, it is possible to prevent ingress of the sealing resin 6 around the electronic component 2c. Therefore, the electronic control device 1 according to this embodiment is preferable in a case where the resin-unsealed electronic component 2c cannot be disposed directly under the connector 5 due to restrictions on layout of components on the control board 3.

According to the electronic control device 1 of this embodiment, the following effects can be obtained in addition to effects similar to those of the first embodiment.

As the frame 4e is provided outside the frame 4d that surrounds the connector 5, it is possible to form the resin-unsealed space 12 not being affected by the ingress of the sealing resin 6 at a place other than the place directly under the connector 5, so that it is possible to facilitate layout of the resin-unsealed electronic component 2c.

Third Embodiment

An electronic control device according to a third embodiment of the present invention will now be described, focusing on differences from the second embodiment. FIG. 4(a) is a plan view of the electronic control device according to this embodiment, FIG. 4(b) is a cross-sectional view in the direction of the arrow A-A of FIG. 4(a), and FIG. 4(c) is a cross-sectional view in the direction of the arrow B-B of FIG. 4(a).

Figure 4:
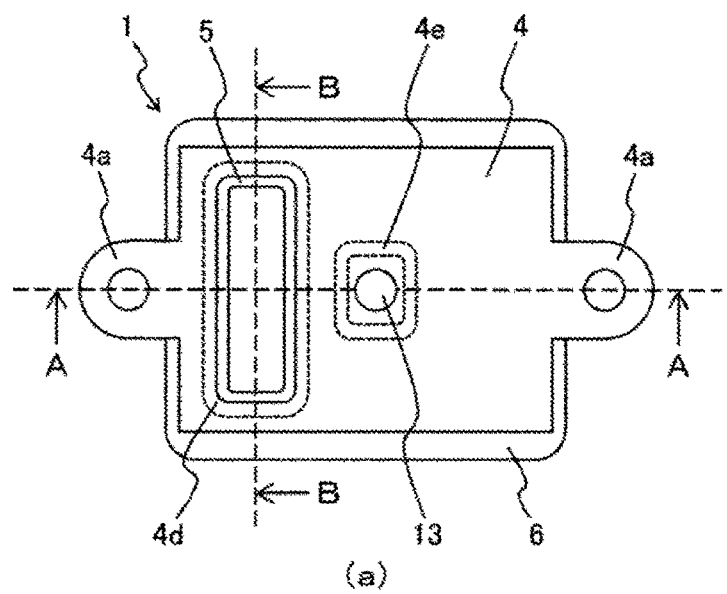
FIG. 4 is a plan view and a cross-sectional view of an electronic control device according to a third embodiment of the present invention.
Figure 4:
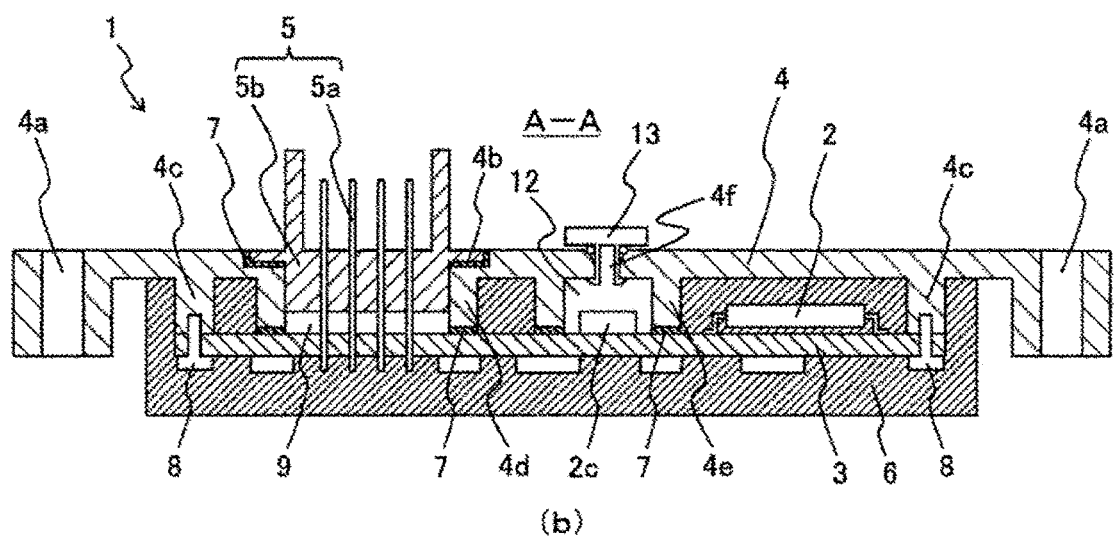
Figure 4:
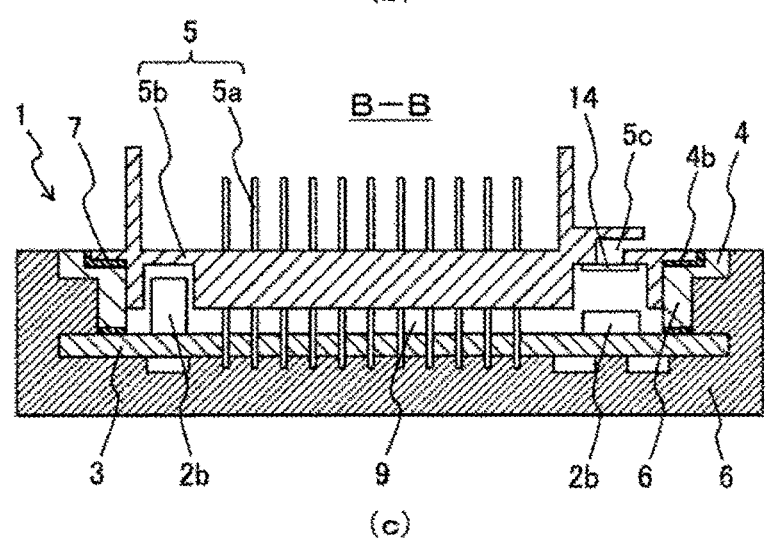

As in FIG. 4, an electronic control device 1 according to this embodiment includes a housing case 4 provided with a through hole 4f that links outside air with a resin-unsealed space 12 where an electronic component 2c is disposed, and the electronic control device 1 includes a breathing filter assembly 13 which is attached to the through hole 4f and has air permeability but not water permeability. Therefore, the electronic control device 1 according to this embodiment is preferable in a case where the resin-unsealed electronic component 2c cannot be disposed directly under a connector 5 due to restrictions on layout of components on a control board 3 and in a case where it is required to maintain ambient air pressure of the electronic component 2c to be equivalent to air pressure of the outside air.

According to the electronic control device 1 of this embodiment, the following effects can be obtained in addition to effects similar to those of the second embodiment.

It is possible to maintain the air pressure of the resin-unsealed space 12 provided with the electronic component 2c to be equivalent to the air pressure of the outside air, so that the control board 3 can be mounted with, for example, a sensor or the like that measures pressure of the outside air.

In a case where an electronic component 2b whose ambient air pressure is required to be maintained at a level equivalent to the air pressure of the outside air is disposed directly under the connector 5, it should be noted that a through hole 5c that links the outside air with the inside of a frame 4e (resin-unsealed space 9) may be provided in a connector housing 5b, as shown in FIG. 4(c), and a breathing filter membrane 14 having air permeability but not water permeability may be attached to the through hole 5c with an adhesive or by thermal welding.

Fourth Embodiment

An electronic control device according to a fourth embodiment of the present invention will now be described, focusing on differences from the first embodiment. FIG. 5(a) is a plan view of the electronic control device according to this embodiment, FIG. 5(b) is a cross-sectional view in the direction of the arrow A-A of FIG. 5(a), and FIG. 5(c) is a cross-sectional view in the direction of the arrow B-B of FIG. 5(a).

Figure 5:
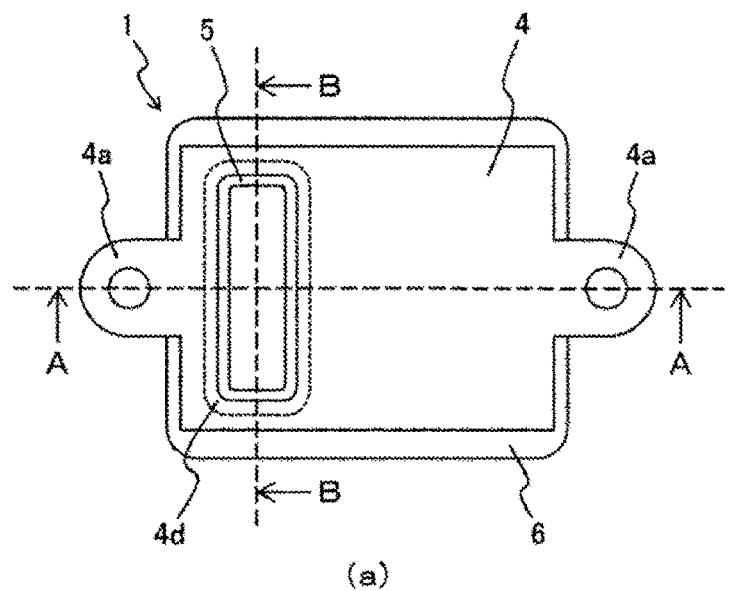
FIG. 5 is a plan view and a cross-sectional view of an electronic control device according to a fourth embodiment of the present invention.
Figure 5:
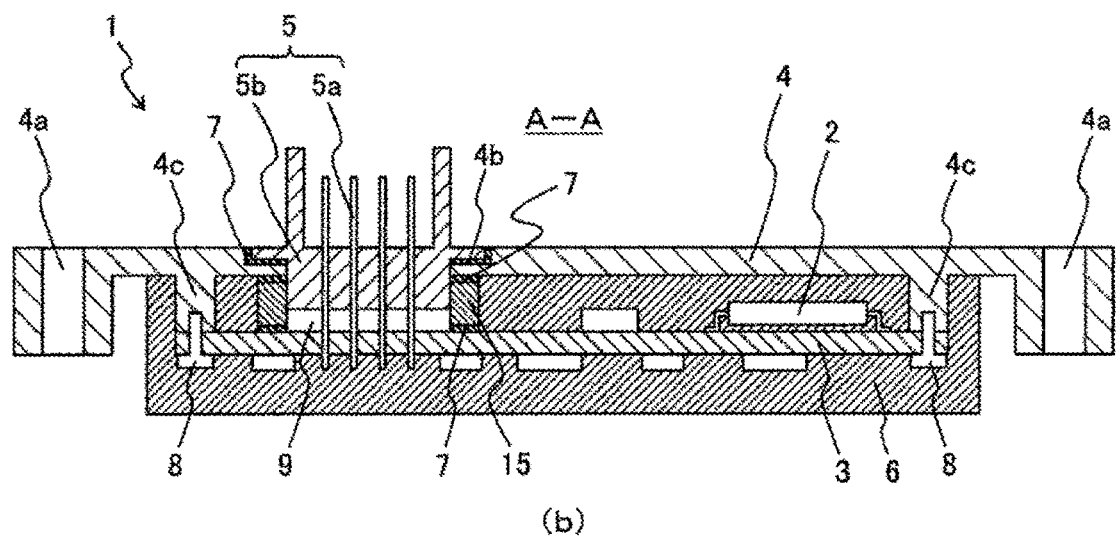
Figure 5:
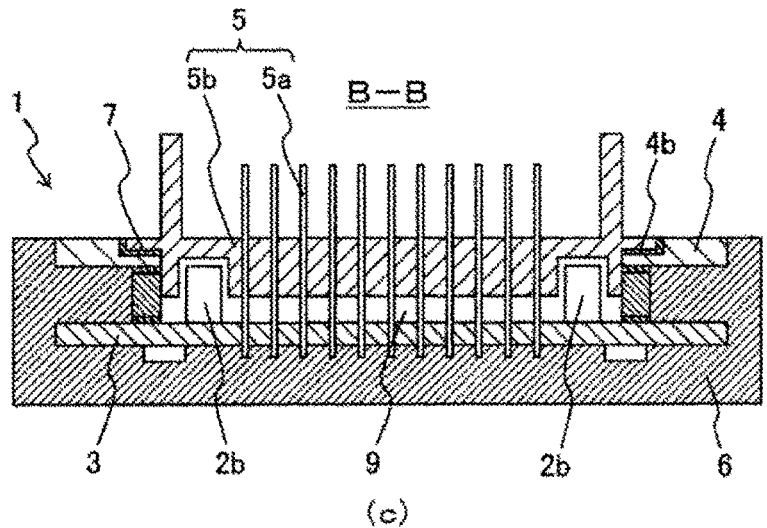

In FIG. 5, an electronic control device 1 according to this embodiment has such a configuration that a frame 4d is not molded with a housing case 4 in an integrated manner and includes another member (hereinafter referred to as "sealing resin-ingress prevention member") 15. When the sealing resin-ingress prevention member 15 is attached to the housing case 4, a seal material 7 is applied to an upper end face the sealing resin-ingress prevention member 15, the seal material 7 is then bonded to a lower surface of the housing case 4 and cured. When a control board 3 is attached to the housing case 4, the seal material 7 is applied to a lower end face (contact portion) of the sealing resin-ingress prevention member 15 that comes into contact with the control board 3, the control board 3 is then placed on the sealing resin-ingress prevention member 15, and the seal material 7 is cured.

According to the electronic control device 1 of this embodiment, the following effects can be obtained in addition to effects similar to those of the third embodiment.

The frame 4d is not molded with the housing case 4 in an integrated manner and includes the sealing resin-ingress prevention member 15, so that the degree of freedom of a material and shape of the frame 4d is improved, and it is possible to design the frame 4d corresponding to demand characteristics. Therefore, the electronic control device 1 shows the desired effect of improvement in reliability.

In addition, since the frame 4d can be manufactured independently from the housing case 4, even in a product model that includes an electronic component 2 laid outed differently, the housing case 4 can be shared without manufacturing a dedicated housing case 4. Therefore, only by changing the layout of the sealing resin-ingress prevention member 15 makes it possible to cope with model change. Accordingly, the electronic control device 1 shows the desired effect of cost reduction.

Although the embodiments of the present invention have been described in detail, the present invention is not restricted to the aforementioned embodiments and includes various modifications. For example, the aforementioned embodiments have been described in detail to give clear descriptions to the present invention. It should be noted that the present invention is not restricted to the one including the whole configurations described above. In addition, a configuration of an embodiment may be partially added to a configuration of another embodiment. Alternatively, a part of a configuration of an embodiment may be deleted or replaced by a part of another embodiment.

REFERENCE SIGNS LIST 1 electronic control device
2, 2a, 2b, 2c electronic components
3 control board
3a through hole
4 housing case
4a vehicle fixing unit
4b connector-mounting unit
4c control board-mounting unit
4d frame (first frame)
4e frame (second frame)
4f through hole (first through hole)
5 connector
5a connector terminal
5b connector housing
5c through hole (second through hole)
6 sealing resin
7 seal material
8 screw
9 resin-unsealed space (first resin-unsealed space)
10 sub-assembly
11 die
11a upper die
11b lower die
12 resin-unsealed space (second resin-unsealed space)
13 breathing filter assembly
14 breathing filter membrane
15 sealing resin-ingress prevention member

The invention claimed is:

1. An electronic control device comprising:
a control board that has a part sealed with a sealing resin;
a connector that is disposed at a position facing another part of the control board and includes a terminal connected to the control board; and
a housing case to which the control board and the connector are fixed, wherein the housing case comprises a first frame which surrounds the connector and comes into contact with the control board, and
wherein the connector is isolated from the sealing resin by the control board and the housing case including the first frame.

2. The electronic control device according to claim 1, wherein the sealing resin is a thermosetting resin.

3. An electronic control device comprising:
a control board that includes a part of the control board is sealed with a sealing resin;
a connector including a terminal connected to the control board; and
a housing case to which the control board and the connector are fixed, wherein the housing case comprises a first frame which surrounds the connector and comes into contact with the control board, and
another part of the control board forms a resin-unsealed space together with the first frame of the housing case and the connector,
the resin-unsealed space not being sealed with resin.

4. The electronic control device according to claim 3, wherein the control board includes a part mounted on the resin-unsealed space.

5. The electronic control device according to claim 4, wherein the sealing resin is a thermosetting resin.

6. The electronic control device according to claim 3, wherein the sealing resin is a thermosetting resin.

7. An electronic control device in which a control board is fixed inside a housing case and the control board is connected to a connector through a terminal, the electronic control device being configured to exchange a signal with the outside,
wherein the electronic control device comprises:
a first frame which surrounds the connector and comes into contact with the control board,
a connector holding unit provided with a gap between the connector and the control board by the first frame so as to hold the connector in the housing case; and
a first resin-unsealed space which cooperates with the control board, the first frame and the connector to prevent ingress of sealing resin into the gap.

8. The electronic control device according to claim 7, wherein the first frame includes a member different from the housing case.

9. The electronic control device according to claim 7,
wherein the housing case comprises a second frame which comes into contact with the control board outside the first frame, and
the electronic control device is formed with a second resin-unsealed space which is not affected by the ingress of the sealing resin between the housing case, the second frame, and the control board.

10. The electronic control device according to claim 9, wherein the control board includes a part mounted on the first resin-unsealed space and the second resin-unsealed space.

11. The electronic control device according to claim 10, wherein the connector includes a connector housing provided with a second through hole that links the first resin-unsealed space with outside air, and the second through hole is provided with a breathing filter membrane which has air permeability but not water permeability.

12. The electronic control device according to claim 11, wherein the connector housing of the connector has a shape corresponding to a shape of an electronic component disposed in the first resin-unsealed space.

13. The electronic control device according to claim 10, wherein the control board includes a part which is mounted on the first resin-unsealed space and higher than the other part of the control board mounted on the second resin-unsealed space.

14. The electronic control device according to claim 9, wherein the electronic control device is provided with an adhesive seal material at contact portions between the first frame and the control board, and the second frame and the control board.

15. The electronic control device according to claim 9, wherein the housing case is provided with a first through hole that links the second resin-unsealed space with outside air, and
the first through hole is provided with a breathing filter assembly which has air permeability but not water permeability.

* * * * *